(12) United States Patent
Malone et al.

(10) Patent No.: US 6,667,885 B2
(45) Date of Patent: Dec. 23, 2003

(54) ATTACHMENT OF A SINGLE HEAT DISSIPATION DEVICE TO MULTIPLE COMPONENTS WITH VIBRATION ISOLATION

(75) Inventors: Christopher Gregory Malone, Folsom, CA (US); Stephen Daniel Cromwell, Penryn, CA (US); Christian Laszlo Belady, Mckinney, TX (US); Eric Clarence Peterson, Mckinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/909,512

(22) Filed: Jul. 20, 2001

(65) Prior Publication Data

US 2003/0016500 A1 Jan. 23, 2003

(51) Int. Cl.⁷ .................................................. H05K 7/20
(52) U.S. Cl. ................. 361/700; 165/104.33; 165/80.3; 174/15.2; 257/715; 257/719; 361/701; 361/703; 361/719; 361/720
(58) Field of Search .............................. 165/80.3, 80.4, 165/185, 104.33; 174/15.2, 16.1, 16.3; 257/714–716, 712, 718–719, 726–727; 361/687, 690, 698–699, 700–704, 707, 715, 719, 720

(56) References Cited

U.S. PATENT DOCUMENTS

| | | | | |
|---|---|---|---|---|
| 5,331,510 A | * | 7/1994 | Ouchi et al. ................. | 361/702 |
| 5,409,055 A | * | 4/1995 | Tanaka et al. ............... | 361/700 |
| 5,549,155 A | * | 8/1996 | Meyer, IV et al. ..... | 165/104.33 |
| 5,960,866 A | * | 10/1999 | Kimura et al. .......... | 165/104.33 |
| 6,061,235 A | * | 5/2000 | Cromwell et al. ........... | 361/690 |
| 6,082,443 A | * | 7/2000 | Yamamoto et al. .... | 165/104.33 |
| 6,163,073 A | * | 12/2000 | Patel .......................... | 257/712 |
| 6,212,074 B1 | * | 4/2001 | Gonsalves et al. .......... | 361/700 |
| 6,397,941 B1 | * | 6/2002 | McCullough ................ | 361/700 |
| 6,424,528 B1 | * | 7/2002 | Chao .......................... | 361/700 |
| 6,449,162 B1 | * | 9/2002 | Corbin, Jr. et al. ......... | 361/719 |
| 6,466,441 B1 | * | 10/2002 | Suzuki ....................... | 361/700 |

* cited by examiner

Primary Examiner—Gregory Thompson (57) ABSTRACT

A method and apparatus to attach multiple components to a common heat dissipation device. One embodiment of the invention involves a method to assemble a plurality of components on a substrate to a heat dissipation device. A second embodiment of the invention involves another method to assemble a plurality of components on a substrate to a heat dissipation device containing one or more heatpipes. A third embodiment of the invention involves an assembled substrate with a plurality of electrical components attached to a common heat dissipation device.

77 Claims, 7 Drawing Sheets

ATTACHMENT OF A SINGLE HEAT DISSIPATION DEVICE TO MULTIPLE COMPONENTS WITH VIBRATION ISOLATION

BACKGROUND OF THE INVENTION

1. Field of the Invention

This invention relates generally to improving the heat dissipation of components assembled on a substrate, and more particularly to providing a thermally reliable attachment of a heat dissipation device to multiple electrical components on a substrate, while maintaining vibration isolation between the heat dissipation device and the multiple electrical components.

2. Description of the Prior Art

In many data processing systems (e.g., computer systems, programmable electronic systems, telecommunication switching systems, control systems, and so forth) one or more electrical components (e.g., central processing unit chips, and other integrated circuit chips operating at very high frequencies) individually dissipate a considerable amount of heat during operation. If the heat dissipation mechanism for cooling such a high power dissipation component is not adequate, then the temperature of the high power dissipation component will quickly rise to a temperature that results in either temporary or permanent operational failure of that component, and typically failure of the entire data processing system dependent on that component.

The industry standard package styles for high power dissipation electrical components frequently consist of ceramic body pin grid arrays (PGAs) for through-hole substrates, or ceramic surface mount equivalents (e.g., land grid array components, ball grid array components, and so forth) for surface mount substrates. The body of an electrical component is frequently thermally coupled to a heat dissipation device (e.g., a heat sink, a heat-pipe, a fluid cooling system, a cooling fan, or other equivalent devices).

A special type of heat-pipe known as a vapor chamber is sometimes used when a large amount of heat dissipation capability is required for a processor chip or other high power dissipation component. A vapor chamber is a relatively expensive single point-of-failure for an electrical component. The failure of a vapor chamber is so catastrophic for an electrical component that a considerable amount of money is spent in fabricating reliable vapor chambers. However, a serious reliability problem has emerged with vapor chambers, since there is no redundant heat conduction path to provide substitute heat dissipation if the vapor chamber fails to operate.

Conventional solutions for this problem involve a variety of unattractive remedies. The most obvious conventional solution is to attach large heat sinks to each high power dissipation component. Unfortunately, this kind of heat dissipation solution taxes the data processing system design with new constraints. Large individual heat sinks on high power dissipation components will block cooling airflows, and require a reduced packing density of components on each substrate, or even a reduced packing density of substrates in the data processing system. The attachment of large individual heat sinks on high power dissipation components can also transmit large vibrational forces to the leads of the components, eventually breaking some electrical connections between the component leads and the substrate. Furthermore, the attachment of separate large heat sinks on high power dissipation components would not eliminate the problems caused by vapor chamber failures, but only reduce the severity and frequency of occurrence of the problems caused by vapor chamber failures.

Figure 1:
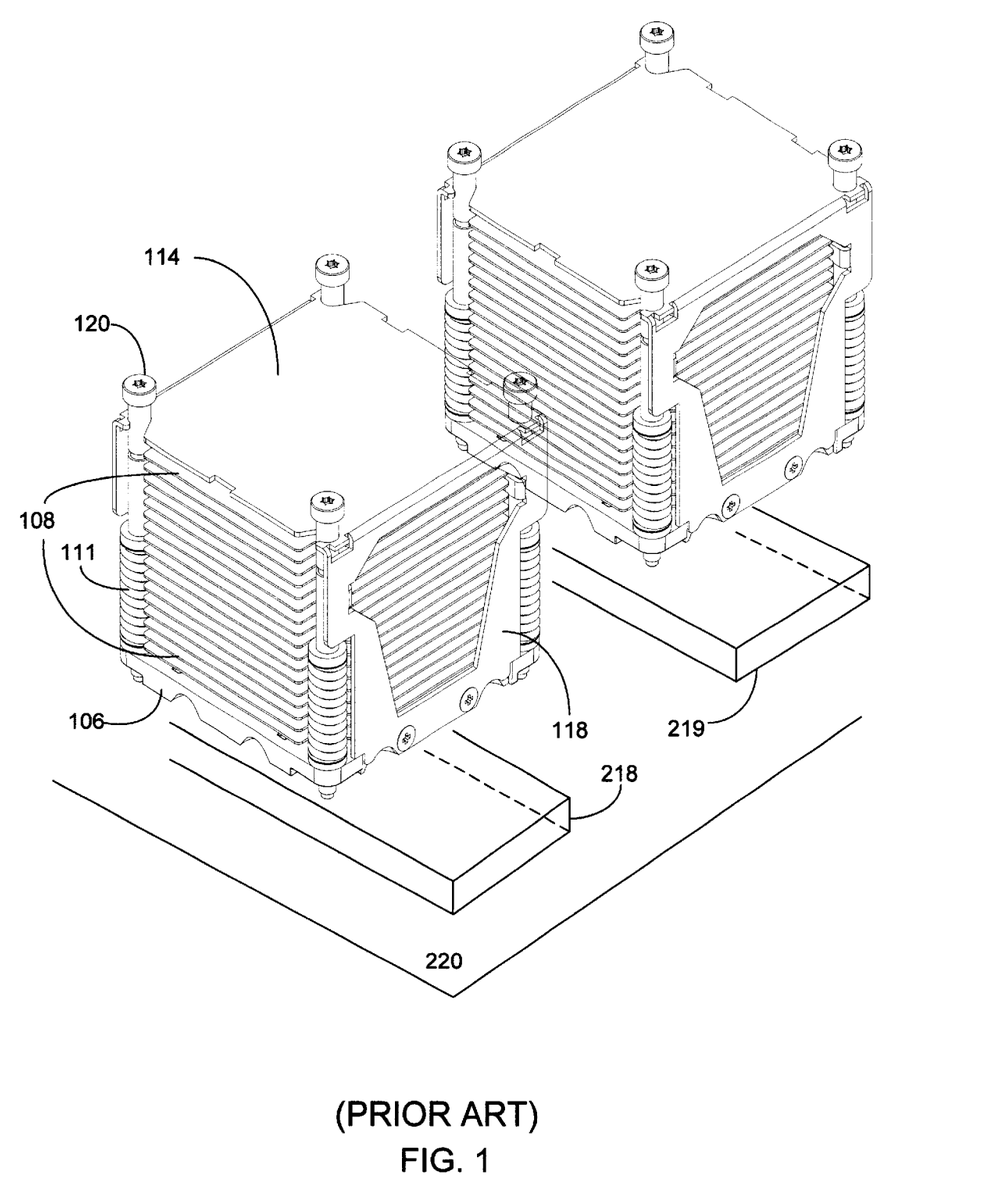
FIG. 1 illustrates two conventional heat dissipation devices attached to two components that are attached to a substrate.

FIG. 1 illustrates two conventional heat dissipation devices attached to two components 218, 219 that are attached to a substrate 220. Each heat dissipation device comprises a vertically stacked plurality of rectangular heat dissipation fins 108, which are enclosed by a hardware structure 114. The hardware structure 114 includes two or more walls 118 (one is shown), and the hardware structure is typically fabricated of the same metal as the heat dissipation device. The hardware structure 114 holds a plurality of screws 120 (typically four long screws are used) and screw springs 111 to attach a base 106 of the heat dissipation device to the substrate 220.

What is needed is an attachment to thermally connect a heat dissipation device to multiple components while maintaining vibration isolation between the heat dissipation device and the multiple components. What is also needed is a heat dissipation device that can use supply redundant, fault-tolerant heat dissipation, instead of using a single vapor chamber for heat dissipation.

SUMMARY OF THE INVENTION

The present invention provides an attachment to thermally connect a heat dissipation device to multiple components while maintaining vibration isolation between the heat dissipation device and the multiple components. The present invention also provides a heat dissipation device that can supply redundant, fault-tolerant heat dissipation, instead of using a single vapor chamber for heat dissipation.

A first aspect of the invention is directed to a method to assemble a plurality of components on a substrate to a heat dissipation device. The method includes attaching a channeled base to the heat dissipation device; thermally attaching one or more heat-pipes to the channeled base; placing the heat dissipation device and the channeled base on the plurality of components on the substrate; and physically attaching the heat dissipation device to the substrate, wherein the heat dissipation device channeled base includes one or more heat-pipes thermally coupled to a component of the plurality of components.

A second aspect of the invention is directed to a method to assemble a plurality of components on a substrate to a heat dissipation device containing one or more heat-pipes. The method includes attaching a base to the heat dissipation device; thermally attaching one or more heat-pipes to the base; placing the base of the heat dissipation device on the plurality of components on the substrate; and attaching the base of the heat dissipation device to the substrate, wherein the heat dissipation device base includes one or more heat-pipes to substantially attain an isothermal heat dissipation device base.

A third aspect of the invention is directed to an assembled substrate with a plurality of electrical components attached to a common heat dissipation device. The assembled substrate includes a substrate; a plurality of electrical components attached to the substrate; a heat dissipation device attached to the plurality of electrical components, wherein the heat dissipation device includes one or more heat-pipes inside the heat dissipation device.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

The present invention provides a multiple component heat dissipation device that uses a lower cost, fault-tolerant group of heat-pipes. The present invention increases the amount of fin area of the heat dissipation device while allowing a shorter profile fin area for improved airflow or higher component packing density. While the discussion below is directed to an application of the invention to processor chips assembled on a substrate (e.g., a PCB), the invention can also be applied to any type of high power dissipation electrical component assembled on any type of substrate (e.g., a multi-chip module, or another substrate upon which electrical components can be assembled).

Figure 2:
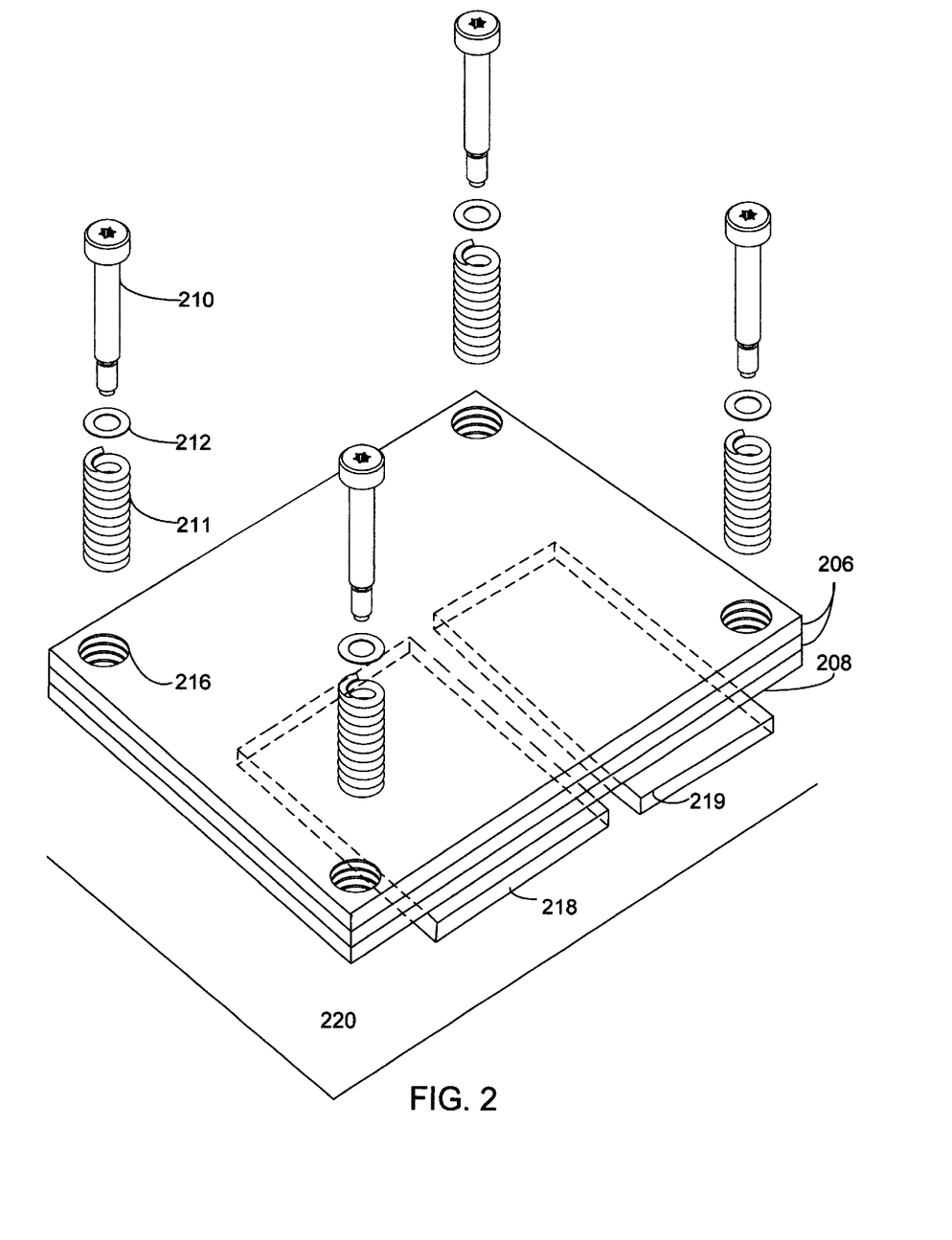
FIG. 2 illustrates an assembly of a heat dissipation device (e.g., a heat-sink) according to one embodiment of the present invention.

FIG. 2 illustrates an assembly of a heat dissipation device (e.g., a heat-sink) according to one embodiment of the present invention. The heat dissipation device assembly includes several heat dissipation fins 206 and a base 208, sitting on two components 218 and 219 attached to a substrate 220. The heat dissipation fins 206 are stacked on spacers (not shown) or fin flanges (not shown) to maintain a uniform stacking separation. The heat dissipation device assembly also includes four short screws 210, four springs 211, and four washers 212. The heat dissipation fins have four holes 216 that are aligned to form vertical wells to receive the four short screws 210, four springs 211, and four washers 212 for attachment to the substrate 220.

Figure 3:
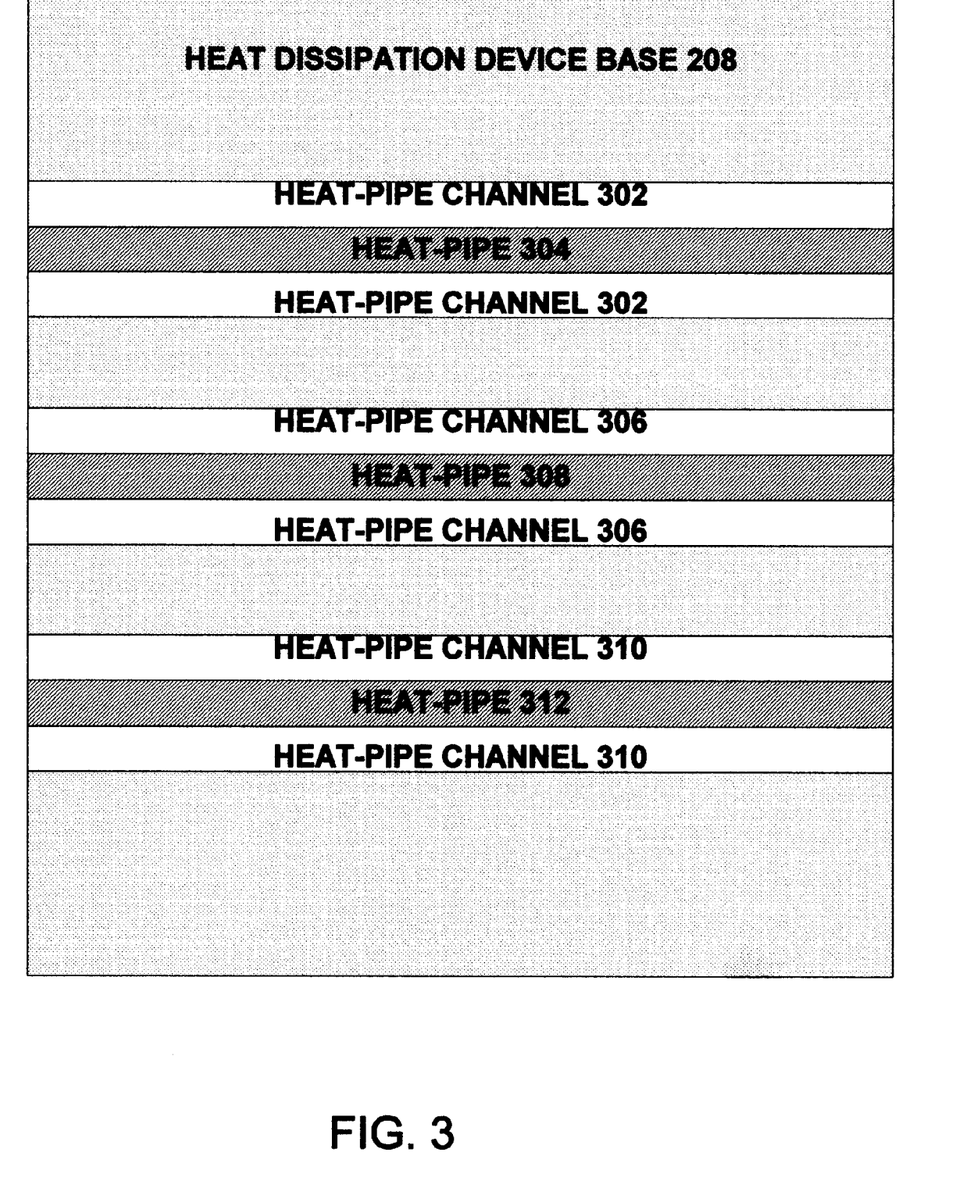
FIG. 3 illustrates a bottom view of the base of the heat dissipation device assembly shown in FIG. 2, according to one embodiment of the present invention.

FIG. 3 illustrates a bottom view of the base 208 of the heat dissipation device assembly shown in FIG. 2, according to one embodiment of the present invention. The heat dissipation device base 208 has three heat-pipe channels 302, 306 and 310, which contain three heat-pipes 304, 308, and 312, respectively. Other embodiments of the invention could use a smaller number (e.g., two) of heat-pipe channels, or use a larger number (e.g., four to over a dozen) heat-pipe channels in the base. These channels could be machined grooves or molded grooves with various cross-sections (e.g., semicircular grooves, rectangular grooves, triangular grooves, and so forth). Alternatively, these channels can be holes, where the heat-pipes can be inserted into holes running all or part of the length of the base, and the holes are drilled (e.g., gun-drilled) or cold-forged. In addition, the heat-pipes can be installed using either an adhesive (e.g., an epoxy) or a solder. In addition, a heat-pipe can be expanded into a hole. Furthermore, each channel can accommodate one or more heat-pipes.

The heat-pipes are preferably standard straight sintered copper heat-pipes, but other types of heat-pipes (e.g., screen wick heat-pipes) can be used in alternate embodiments of the invention. The heat-pipe diameters are preferably 0.25 inches (0.63 centimeters), but the diameters can be either smaller or larger in alternate embodiments of the invention. The heat-pipes are preferably embedded and partially exposed on the heat dissipation device base, but in alternative embodiments of the invention the heat-pipes can be completely enclosed in the heat dissipation device base. The heat dissipation device base thickness preferably ranges in thickness from approximately 0.4 inches (1.0 centimeter) to 0.2 inches (0.5 centimeter), but in alternative embodiments of the invention the heat dissipation device base can be thinner or thicker as needed. In alternative embodiments, the heat dissipation device base can itself be used as a platform for attached electrical components (e.g., ICs, resistors, capacitors, inductors, and related electrical components).

Figure 4:
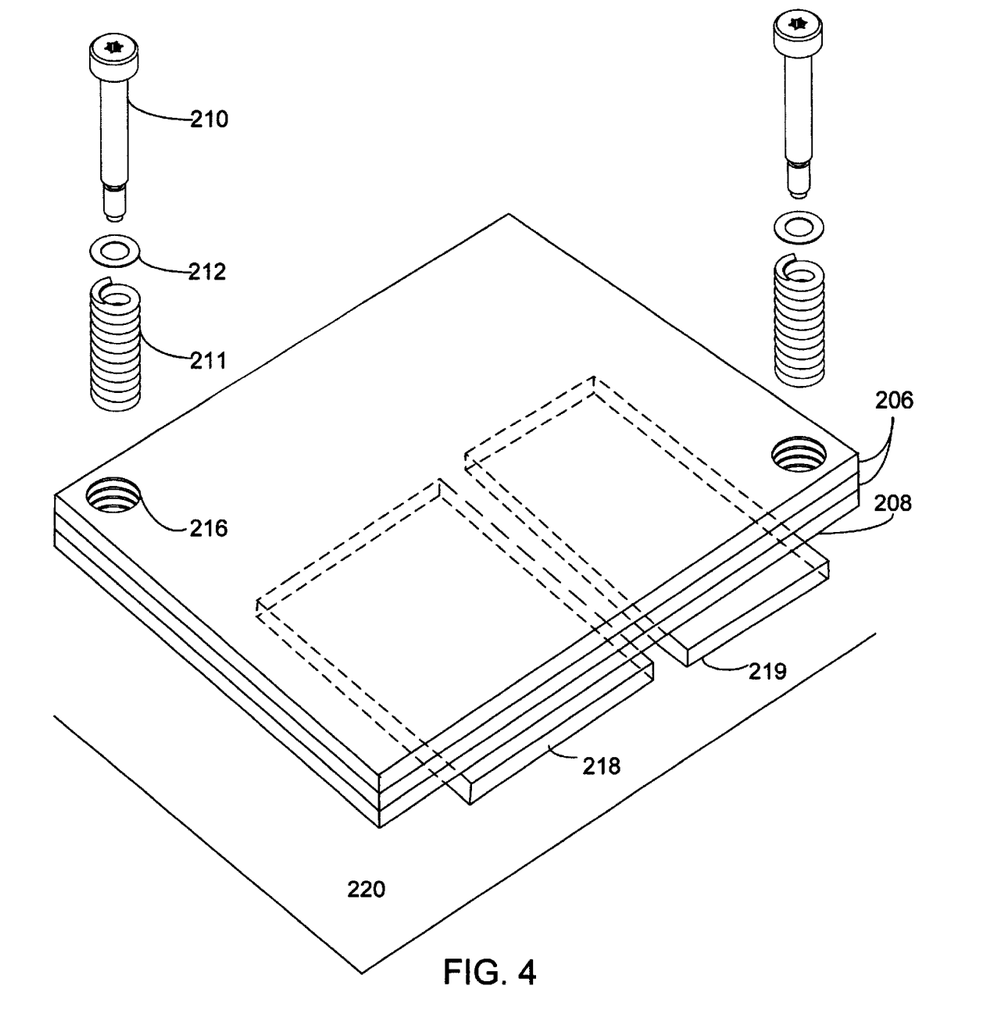
FIG. 4 illustrates an assembly of a heat dissipation device according to another embodiment of the invention.

FIG. 4 illustrates an assembly of a heat dissipation device (e.g., a heat-sink) according to another embodiment of the invention. The heat dissipation device assembly includes several heat dissipation fins 206 and a base 208, sitting on two components 218 and 219 attached to a substrate 220. The heat dissipation fins 206 can be stacked on spacers (not shown) or fin flanges (not shown) to maintain a uniform stacking separation. The heat dissipation device assembly also includes two short screws 210, two springs 211, and two washers 212. The heat dissipation fins have two holes 216 that are aligned to form vertical wells to receive the two short screws 210, two springs 211, and two washers 212 for attachment to the substrate 220.

Figure 5:
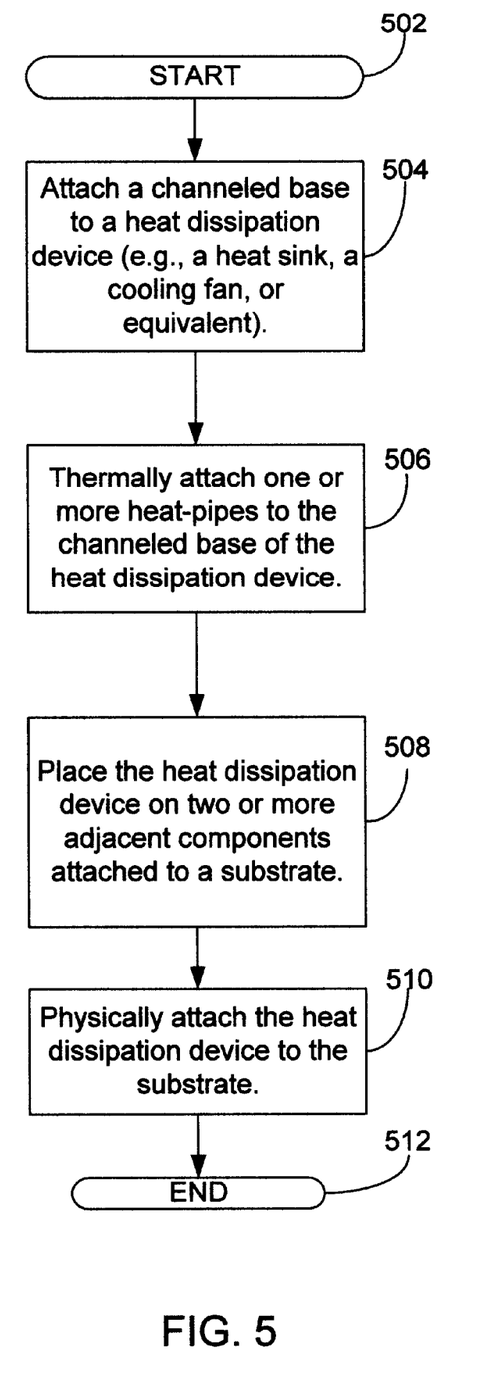
FIG. 5 shows a flow chart for a method to assemble a heat dissipation device to a plurality of components in accordance with an embodiment of the present invention.

FIG. 5 shows a flow chart for a method to assemble a heat dissipation device to a plurality of components in accordance with an embodiment of the present invention. The method starts in operation 502, and is followed by operation 504. In operation 504, there is an attachment of a channeled base to a heat dissipation device (e.g., a heat-pipe, heat-sink, fluid cooling device, cooling fan, or an equivalent). In operation 506, two or more heat-pipes are thermally attached to the channeled base of the heat dissipation device. Then operation 508 is next. In operation 508 the heat dissipation device is placed on the two or more components. In operation 510, the heat dissipation device is physically attached to the substrate, by screws, bolts, solder, or by an equivalent attachment method. In alternate embodiments, ICs or passive components (e.g., capacitors, resistors, and inductors) can be attached to the heat dissipation device base itself, either before or after the heat dissipation device is attached to the substrate. Operation 512 is the end of the method.

Figure 6:
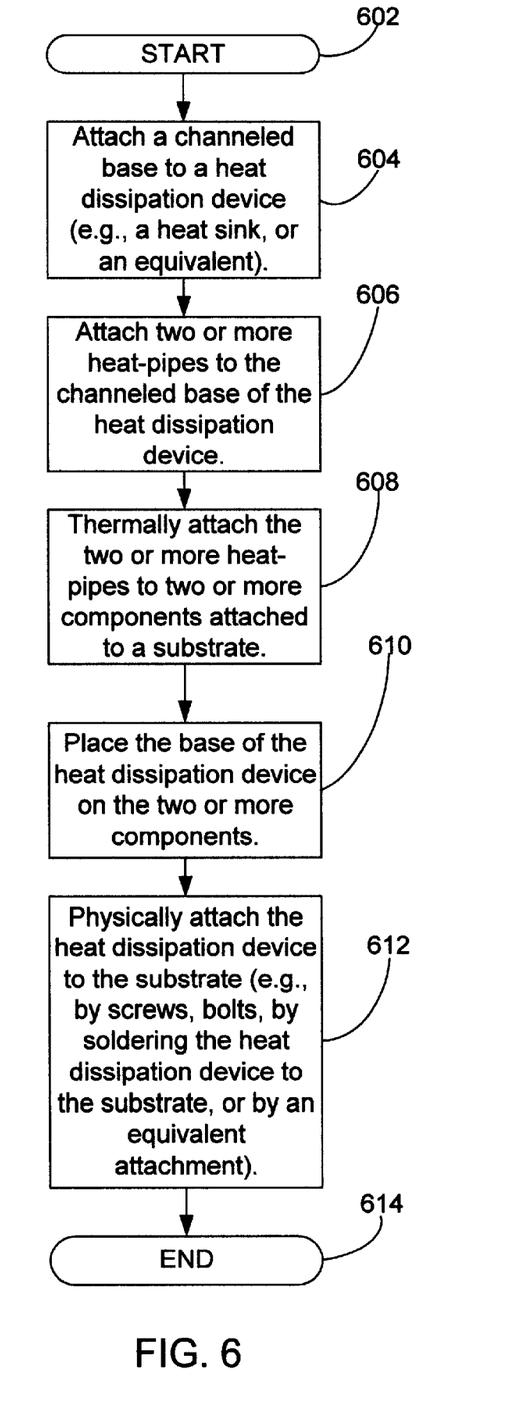
FIG. 6 shows another flow chart for a method to assemble a heat dissipation device to a plurality of components in accordance with another embodiment of the present invention.

FIG. 6 shows another flow chart for a method to assemble a heat dissipation device to a plurality of components in accordance with another embodiment of the present invention. The method starts in operation 602, and is followed by operation 604. In operation 604, there is an attachment of a channeled base to a heat dissipation device (e.g., a heat-pipe, heat-sink, fluid cooling device, cooling fan, or an equivalent). In operation 606, two or more heat-pipes are attached to the channeled base of the heat dissipation device. Then operation 608 is next. In operation 608, two or more heat-pipes are attached to two or more components attached to a substrate. In operation 610, the base of the heat dissipation device is placed on the two or more components. In operation 612, the heat dissipation device is physically attached to the substrate, by screws, bolts, solder, or by an equivalent attachment method. In alternate embodiments, ICs or passive components (e.g., capacitors, resistors, and inductors) can be attached to the heat dissipation device base itself, either before or after the heat dissipation device is attached to the substrate. Operation 614 is the end of the method.

Figure 7:
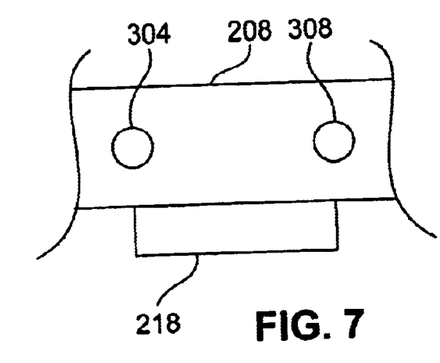
FIG. 7 is a partial side elevational view of the heat dissipation base having embedded heat pipes and in contact with an electrical component.

FIG. 7 is a partial side elevational view of the heat dissipation base 208 having embedded heat pipes 304 and 308 and in contact with an electrical component 218.

Figure 8:
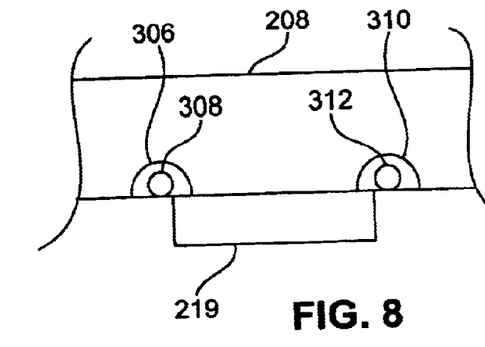
FIG. 8 is a partial side elevational view of the heat dissipation base in contact with an electrical component and having channels with heat pipes lodged therein.

FIG. 8 is a partial side elevational view of the heat dissipation base 208 in contact with an electrical component 219 and having channels 306 and 310 with heat pipes 308 and 312 lodges therein, respectively.

Figure 9:
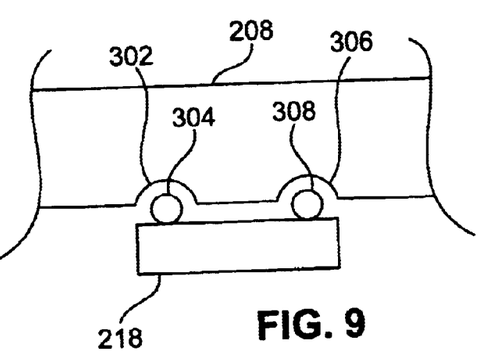
FIG. 9 is a partial side elevational view of the heat dissipation base including channels having heat pipes lodged therein and coupled to an electrical component.

FIG. 9 is a partial side elevational view of the heat dissipation base 208 including channels 302 and 306 having heat pipes 304 and 308 lodged therein, respectively, and coupled to an electrical component 218.

The embodiments of the invention discussed above used examples of electrical components. However, alternative embodiments of the invention can be applied to other heat generating components (e.g., engines, generators, or other heat generating devices). Additionally, various embodiments of the invention that are applied to electrical component can be applied to PCBs using through-hole technology or surface mount technology, or other types of electrical component substrates (e.g., multi-chip modules and flexible substrates).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method for assembling a heat dissipation assembly to at least one component, comprising:
   providing a heat dissipation base having a structure defining a plurality of base channels in an interior of the heat dissipation base, the heat dissipation base including a plurality of holes and a flat top surface for supporting a heat dissipation fin;
   disposing a heat-pipe in each of said base channels to produce a heat dissipation assembly having a plurality of heat-pipes;
   placing said heat dissipation base on at least one component supported by a substrate; and
   coupling said heat dissipation base to said substrate by use of screws, wherein each one of the screws is inserted into an associated one of the holes in the heat dissipation base and wherein the screws are attached to the substrate.

2. The method of claim 1 wherein said heat dissipation base comprises a pair of opposed sides, and said base channels and heat pipes extend from one opposed side to the other opposed side.

3. The method of claim 1 wherein said heat pipes are coupled to said component.

4. The method of claim 2 wherein said heat pipes are coupled to said component.

5. The method of claim 1 additionally comprising maintaining said heat dissipation base at substantially an isothermal condition.

6. The method of claim 2 additionally comprising maintaining said heat dissipation base at substantially an isothermal condition.

7. The method of claim 4 additionally comprising maintaining said heat dissipation base at substantially an isothermal condition.

8. The method of claim 1 wherein said base channels and heat pipes are parallel with respect to each other.

9. The method of claim 2 wherein said base channels and heat pipes are parallel with respect to each other.

10. The method of claim 4 wherein said base channels and heat pipes are parallel with respect to each other.

11. The method of claim 7 wherein said base channels and heat pipes are parallel with respect to each other.

12. The method of claim 1 wherein said component comprises an electrical component.

13. The method of claim 11 wherein said component comprises an electrical component.

14. The method of claim 1 wherein said substrate is selected from the group consisting of a printed circuit board (PCB), a multi-chip module (MOM), and a flexible substrate.

15. The method of claim 13 wherein said substrate is selected from the group consisting of a printed circuit board (PCB), a multi-chip module (MCM), and a flexible substrate.

16. The method of claim 1 wherein said heat pipes are partially exposed to said component.

17. The method of claim 2 wherein said heat pipes are partially exposed to said component.

18. The method of claim 8 wherein said heat pipes are partially exposed to said component.

19. The method of claim 1, further comprising:
   disposing at least one heat dissipation fin on the heat dissipation base.

20. The method of claim 19, wherein the dissipation fin includes a plurality of fin holes, and wherein each fin hole is aligned with a corresponding hole in the heat dissipation base to form a vertical well to receive one of the screws when the screws are attached to the substrate.

21. A method for assembling a heat dissipation assembly to at least one component, comprising:
   providing a heat dissipation assembly including a heat dissipation base having a plurality heat-pipes embedded in an interior of the heat dissipation base, the heat dissipation base including a plurality of holes and a flat top surface for supporting a heat dissipation fin;
   placing said heat dissipation base on at least one component supported by a substrate; and
   coupling said heat dissipation base to said substrate by use of screws, wherein each one of the screws is inserted into an associated one of the holes in the heat dissipation base and wherein the screws are attached to the substrate.

22. The method of claim 21 wherein said heat dissipation base comprises a pair of opposed sides, and said heat pipes extend from one opposed side to the other opposed side.

23. The method of claim 21 additionally comprising maintaining said heat dissipation base at substantially an isothermal condition.

24. The method of claim 22 additionally comprising maintaining said heat dissipation base at substantially an isothermal condition.

25. The method of claim 21 wherein said heat pipes are parallel with respect to each other.

26. The method of claim 22 wherein said heat pipes are parallel with respect to each other.

27. The method of claim 24 wherein said heat pipes are parallel with respect to each other.

28. The method of claim 21 wherein said component comprises an electrical component.

29. The method of claim 22 wherein said component comprises an electrical component.

30. The method of claim 27 wherein said component comprises an electrical component.

31. The method of claim 21 wherein said substrate is selected from the group consisting of a printed circuit board (PCB), a multi-chip module (MCM), and a flexible substrate.

32. The method of claim 30 wherein said substrate is selected from the group consisting of a printed circuit board (PCB), a multi-chip module (MCM), and a flexible substrate.

33. The method of claim 21, further comprising:
disposing at least one heat dissipation fin on the heat dissipation base.

34. The method of claim 33, wherein the dissipation fin includes a plurality of fin holes, and wherein each fin hole is aligned with a corresponding hole in the heat dissipation base to form a vertical well to receive one of the screws when the screws are attached to the substrate.

35. A substrate assembly comprising a substrate; at least one component supported by said substrate; a heat dissipation assembly coupled to said substrate and including a heat dissipation base having a structure defining a plurality of base channels having a plurality of heat-pipes disposed in said plurality of base channels in an interior of the heat dissipation base, the heat dissipation base including a plurality of holes and a flat top surface for supporting a heat dissipation fin, wherein the heat dissipation base is placed on the at least one component and wherein the heat dissipation base is coupled to the substrate by screws, each one of the screws is inserted into an associated one of the holes in the heat dissipation base and wherein the screws are attached to the substrate.

36. The substrate assembly of claim 35 wherein said heat dissipation base comprises a pair of opposed sides, and each of said base channels has a heat pipe and extends from one opposed side to the other opposed side.

37. The substrate assembly of claim 35 wherein said heat dissipation base comprises a pair of opposed sides, and said base channels and said heat pipes extend from one opposed side to the other opposed side.

38. The substrate assembly of claim 35 wherein said heat dissipation base comprises a pair of opposed sides, and each of said base channels has a heat pipe, and said base channels and said heat pipes extend from one opposed side to the other opposed side.

39. The substrate assembly of claim 35 wherein said heat pipes are parallel with respect to each other.

40. The substrate assembly of claim 36 wherein said heat pipes are parallel with respect to each other.

41. The substrate assembly of claim 37 wherein said heat pipes are parallel with respect to each other.

42. The substrate assembly of claim 38 wherein said heat pipes are parallel with respect to each other.

43. The substrate assembly of claim 35 wherein said heat pipes are coupled to said component.

44. The substrate assembly of claim 36 wherein said heat pipes are coupled to said component.

45. The substrate assembly of claim 37 wherein said heat pipes are coupled to said component.

46. The substrate assembly of claim 38 wherein said heat pipes are coupled to said component.

47. The substrate assembly of claim 39 wherein said heat pipes are coupled to said component.

48. The substrate assembly of claim 40 wherein said heat pipes are coupled to said component.

49. The substrate assembly of claim 41 wherein said heat pipes are coupled to said component.

50. The substrate assembly of claim 42 wherein said heat pipes are coupled to said component.

51. The substrate assembly of claim 35 wherein said heat pipes are partially exposed to said component.

52. The substrate assembly of claim 38 wherein said heat pipes are partially exposed to said component.

53. The substrate assembly of claim 39 wherein said heat pipes are partially exposed to said component.

54. The substrate assembly of claim 40 wherein said heat pipes are partially exposed to said component.

55. The substrate assembly of claim 41 wherein said heat pipes are partially exposed to said component.

56. The substrate of claim 35, further comprising:
at least one heat dissipation fin disposed on the heat dissipation base.

57. The substrate of claim 56, wherein the dissipation fin includes a plurality of fin holes, and wherein each fin hole is aligned with a corresponding hole in the heat dissipation base to form a vertical well to receive one of the screws when the screws are attached to the substrate.

58. A substrate assembly comprising a substrate; at least one component supported by said substrate; a heat dissipation assembly coupled to said substrate and including a heat dissipation base and a plurality of heat-pipes embedded in an interior of said heat dissipation base, the heat dissipation base including a plurality of holes and a flat top surface for supporting a heat dissipation fin, wherein the heat dissipation base is placed on the at least one component and wherein the heat dissipation base is coupled to the substrate by screws, each one of the screws is inserted into an associated one of the holes in the heat dissipation base and wherein the screws are attached to the substrate.

59. The substrate assembly of claim 58 wherein said heat dissipation base comprises a pair of opposed sides, and said heat pipes extend from one opposed side to the other opposed side.

60. The substrate assembly of claim 58 wherein said heat pipes are parallel with respect to each other.

61. The substrate assembly of claim 59 wherein said heat pipes are parallel with respect to each other.

62. The substrate assembly of claim 59 wherein said substrate is selected from the group consisting of a printed circuit board (PCB), a multi-chip module (MCM), and a flexible substrate.

63. The substrate of claim 58, further comprising:
at least one heat dissipation fin disposed on the heat dissipation base.

64. The substrate of claim 63, wherein the dissipation fin includes a plurality of fin holes, and wherein each fin hole is aligned with a corresponding hole in the heat dissipation base to form a vertical well to receive one of the screws when the screws are attached to the substrate.

65. A method for assembling a heat dissipation assembly to at least one component, comprising:
providing a heat dissipation base having a structure defining at least one base channel, the heat dissipation base including a plurality of holes and a flat top surface for supporting a heat dissipation fin;
disposing a heat-pipe in the at least one base channel in an interior of the heat dissipation base;
placing said heat dissipation base on at least one component that is supported by a substrate; and
coupling said heat dissipation base to said substrate by use of screws, wherein each one of the screws is inserted into an associated one of the holes in the heat dissipation base and wherein the screws are attached to the substrate.

66. The method of claim 65 wherein the at least one base channel and the heat pipe are parallel with respect to each other.

67. The method of claim 65 wherein said component comprises an electrical component.

68. The method of claim 65 wherein the substrate is selected from the group consisting of a printed circuit board (PCB), a multi-chip module (MCM), and a flexible substrate.

69. The method of claim 65, further comprising:
disposing at least one heat dissipation fin on the heat dissipation base.

70. The method of claim 69, wherein the dissipation fin includes a plurality of fin holes, and wherein each fin hole is aligned with a corresponding hole in the heat dissipation base to form a vertical well to receive one of the screws when the screws are attached to the substrate.

71. A substrate assembly comprising a substrate; at least one component supported by said substrate; a heat dissipation assembly coupled to said substrate and including a heat dissipation base having a structure defining at least one base channel having a heat-pipe disposed in the at least one base channel in an interior of the heat dissipation base, the heat dissipation base including a plurality of holes and a flat top surface for supporting a heat dissipation fin, wherein the heat dissipation base is placed on the at least one component and wherein the heat dissipation base is coupled to the substrate by screws, each one of the screws is inserted into an associated one of the holes in the heat dissipation base and wherein the screws are attached to the substrate.

72. The substrate assembly of claim 71, wherein said heat dissipation base comprises a pair of opposed sides, and each of the at least one base channel has a heat pipe and extends from one opposed side to the other opposed side.

73. The substrate assembly of claim 71, wherein the at least one base channel and the heat pipe are parallel with respect to each other.

74. The substrate assembly of claim 71, wherein the component comprises an electrical component.

75. The substrate of claim 71 wherein the substrate is selected from the group consisting of a printed circuit board (PCB), a multi-chip module (MCM), and a flexible substrate.

76. The substrate of claim 71, further comprising:
at least one heat dissipation fin disposed on the heat dissipation base.

77. The substrate of claim 76, wherein the dissipation fin includes a plurality of fin holes, and wherein each fin hole is aligned with a corresponding hole in the heat dissipation base to form a vertical well to receive one of the screws when the screws are attached to the substrate.

* * * * *